(12) United States Patent
Graff et al.

(10) Patent No.: US 6,492,026 B1
(45) Date of Patent: Dec. 10, 2002

(54) SMOOTHING AND BARRIER LAYERS ON HIGH TG SUBSTRATES

(75) Inventors: Gordon Lee Graff, West Richland, WA (US); Mark Edward Gross, Pasco, WA (US); Ming Kun Shi, Richland, WA (US); Michael Gene Hall, West Richland, WA (US); Peter Maclyn Martin, Kennewick, WA (US); Eric Sidney Mast, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 09/553,191

(22) Filed: Apr. 20, 2000

(51) Int. Cl.$^7$ .................. B32B 15/01; B32B 18/00; B32B 27/00; B32B 27/30; B32B 27/32

(52) U.S. Cl. .............. 428/411.1; 428/412; 428/419; 428/426; 428/457; 428/473.5; 428/500; 428/522

(58) Field of Search ................. 428/1.6, 411.1, 428/412, 426, 446, 474.4, 457, 500, 522, 681, 419, 473.5

(56) References Cited

U.S. PATENT DOCUMENTS

| | | | |
|---|---|---|---|
| 3,475,307 A | 10/1969 | Knox et al. | |
| 3,607,365 A | 9/1971 | Lindlof | |
| 4,098,965 A | 7/1978 | Kinsman | |
| 4,283,482 A | 8/1981 | Hattori et al. | |
| 4,581,337 A | 4/1986 | Frey et al. | |
| 4,624,867 A | 11/1986 | Iijima et al. | |
| 4,695,618 A | 9/1987 | Mowrer | |
| 4,842,893 A | 6/1989 | Yializis et al. | |
| 4,954,371 A | 9/1990 | Yializis | |
| 5,032,461 A | 7/1991 | Shaw et al. | |
| 5,036,249 A | 7/1991 | Pike-Biegunski et al. | |

(List continued on next page.)

FOREIGN PATENT DOCUMENTS

| | | |
|---|---|---|
| BE | 704 297 | 9/1997 |
| DE | 19603746 | 4/1997 |
| EP | 0 299 753 | 1/1989 |
| EP | 0 340 935 | 11/1989 |
| EP | 0 390 540 | 10/1990 |
| EP | 0 547 550 | 6/1993 |
| EP | 0 590 467 A1 | 9/1993 |
| EP | 0 722 787 | 7/1996 |
| EP | 0 777 280 A | 6/1997 |
| EP | 0 787 826 | 8/1997 |
| EP | 0 916 394 | 5/1999 |
| EP | 0 931 850 A1 | 7/1999 |
| EP | 0 977 469 | 2/2000 |
| JP | 63136316 | 6/1988 |

(List continued on next page.)

OTHER PUBLICATIONS

Klemberg–Sapieha, J.E. et al., "Transparent Gas Barrier Coatings Produced by Dual–Frequency PECVD" 36th Annual Technical Conference Proceedings, 1993, pp. 445–449, Dec. 1993.

Krug, T. et al., "New Developments in Transparent Barrier Coatings" 36th Annual Technical Conference Proceedings, 1993, pp. 302–305, Dec. 1993.

Shaw, D.G. et al., "Use of Vapor Deposited Acrylate Coatings to Improve the Barrier Properties of Metallized Film" 37th Annual Technical Conference Proceedings, 1994, pp. 240–244, Dec. 1994.

(List continued on next page.)

*Primary Examiner*—Paul Thibodeau
*Assistant Examiner*—Ramsey Zacharia
(74) *Attorney, Agent, or Firm*—Killworth, Gottman, Hagan & Schaeff, L.L.P.

(57) ABSTRACT

A high temperature substrate having improved properties. The substrate is a polymer substrate having a glass transition temperature greater than about 120° C., and at least one first barrier stack adjacent to the polymer substrate. The barrier stack includes at least one first barrier layer and at least one first polymer layer. A method for making the high temperature substrate with improved properties is also disclosed.

19 Claims, 1 Drawing Sheet

U.S. PATENT DOCUMENTS

| | | |
|---|---|---|
| 5,124,204 A | 6/1992 | Yamashita et al. |
| 5,189,405 A | 2/1993 | Yamashita et al. |
| 5,237,439 A | 8/1993 | Misono et al. |
| 5,260,095 A | 11/1993 | Affinito |
| 5,354,497 A | 10/1994 | Fukuchi et al. |
| 5,395,644 A | 3/1995 | Affinito |
| 5,427,638 A | 6/1995 | Goetz et al. |
| 5,440,446 A | 8/1995 | Shaw et al. |
| 5,536,323 A | 7/1996 | Kirlin et al. |
| 5,547,508 A | 8/1996 | Affinito |
| 5,554,220 A | 9/1996 | Forrest et al. |
| 5,576,101 A | 11/1996 | Saitoh et al. |
| 5,607,789 A | 3/1997 | Treger et al. |
| 5,620,524 A | 4/1997 | Fan et al. |
| 5,629,389 A | 5/1997 | Roitman et al. |
| 5,654,084 A | 8/1997 | Egert |
| 5,681,615 A | 10/1997 | Affinito et al. |
| 5,681,666 A | 10/1997 | Treger et al. |
| 5,684,084 A | 11/1997 | Lewin et al. |
| 5,686,360 A | 11/1997 | Harvey, III et al. |
| 5,693,956 A | 12/1997 | Shi et al. |
| 5,711,816 A | 1/1998 | Kirlin et al. |
| 5,725,909 A | 3/1998 | Shaw et al. |
| 5,731,661 A | 3/1998 | So et al. |
| 5,736,207 A | 4/1998 | Walther et al. ............ 428/35.7 |
| 5,747,182 A | 5/1998 | Friend et al. |
| 5,757,126 A | 5/1998 | Harvey, III et al. |
| 5,759,329 A | 6/1998 | Krause et al. |
| 5,771,562 A | 6/1998 | Harvey, III et al. |
| 5,792,550 A | 8/1998 | Phillips et al. |
| 5,811,177 A | 9/1998 | Shi et al. |
| 5,811,183 A | 9/1998 | Shaw et al. |
| 5,821,692 A | 10/1998 | Rogers et al. |
| 5,844,363 A | 12/1998 | Gu et al. |
| 5,872,355 A | 2/1999 | Hueschen |
| 5,902,641 A | 5/1999 | Affinito et al. |
| 5,902,688 A | 5/1999 | Antoniadis et al. |
| 5,904,958 A | 5/1999 | Dick et al. |
| 5,912,069 A | 6/1999 | Yializis et al. |
| 5,922,161 A | 7/1999 | Wu et al. |
| 5,945,174 A | 8/1999 | Shaw et al. |
| 5,948,552 A | 9/1999 | Antoniadis et al. |
| 5,952,778 A | 9/1999 | Haskal et al. |
| 5,965,907 A | 10/1999 | Huang et al. |
| 5,994,174 A * | 11/1999 | Carey et al. ................ 438/166 |
| 5,996,498 A | 12/1999 | Lewis |
| 6,045,864 A | 4/2000 | Lyons et al. |
| 6,083,628 A | 7/2000 | Yializis |
| 6,087,007 A * | 7/2000 | Fujii et al. .................. 428/412 |
| 6,146,225 A * | 11/2000 | Sheats et al. ................ 445/24 |
| 6,198,217 B1 | 3/2001 | Suzuki et al. |

FOREIGN PATENT DOCUMENTS

| | | |
|---|---|---|
| JP | 64-18441 | 1/1989 |
| JP | 2-183230 | 7/1990 |
| JP | 08325713 | 12/1996 |
| JP | 09059763 | 3/1997 |
| WO | WO 87 07848 | 12/1987 |
| WO | WO 95 10117 | 4/1995 |
| WO | WO 96/23217 A | 8/1996 |
| WO | WO 97 04885 | 2/1997 |
| WO | WO 97 22631 | 6/1997 |
| WO | WO 98 10116 | 3/1998 |
| WO | WO 98 18852 | 5/1998 |
| WO | WO 99 16557 | 4/1999 |
| WO | WO 99 16931 | 4/1999 |

OTHER PUBLICATIONS

Hoffmann, G. et al. "Transparent Barrier Coatings by Reactive Evaporation" 37th Annual Technical Conference Proceedings, 1994, pp. 155–160, Dec. 1994.

Kukla, R. et al., "Transparent Barrier Coatings with EB–Evaporation, an Update" Thirteenth International Conference on Vacuum Web Coating, 1999, pp. 223–233, Dec. 1999.

Hibino, N. et al., "Transparent Barrier Al2O3 Coating by Activated Reactive Evaporation" Thirteenth International Conference on Vacuum Web Coating, 1999, pp. 234–246, Dec. 1991.

Henry, B.M. et al., "Microstructural Studies of Transparent Gas Barrier Coatings on Polymer Substrates" Thirteenth International Conference on Vacuum Web Coatings, 1999, pp. 265–273, Dec. 1999.

Bright, C.I. et al., Transparent Barrier Coatings Based on ITO for Flexible Plastic Displays, Thirteenth International Conference on Vacuum Web Coating, 1999, pp. 247–255, Dec. 1999.

Finson E. et al., "Transparent SiO2 Barrier Coatings: Conversion and Production Status" 37th Annual Technical Conference Proceedings, 1994, pp. 139–143, Dec. 1994.

Yializis, A., "High Oxygen Barrier Polypropylene Films Using Transparent Acrylate–A2O3 and Opaque Al–Acrylate Coatings" 38th Annual Technical Conference Proceedings, 1995, pp. 95–102, Dec. 1995

Yamada, Y. et al., "The Properties of a New Transparent and Colorless Barrier Film" 38th Annual Technical Conference Proceedings, 1995, pp. 28–31, Dec. 1995.

Chahroudi, D., "Transparent Glass Barrier Coatings for Flexible Film Packaging" 34th Annual Technical Conference Proceedings, 1991, pp. 130–133, Dec. 1991.

Yializis A. et al., "Ultra High Barrier Films" 43rd Annual Technical Conference Proceedings, Denver, Apr. 15–20, 2000, pp. 404–407.

Felts, J.T., "Transparent Barrier Coatings Update: Flexible Substrates" 36th Annual Technical Conference Proceedings, 1993, pp. 324–331, Dec. 1993.

Norenberg H. et al., "Comparative Study of Oxygen Permeation Through Polymers and Gas Barrier Films" 43rd Annual Technical Conference Proceedings, Denver, Apr. 15–20, 2000, pp. 347–351.

Henry, B.M. et al., "Microstructural and Gas Barrier Properties of Transparent Aluminum Oxide and Indium Tin Oxide Films" 43rd Annual Technical Conference Proceedings, Denver, Apr. 15–20, 2000, pp. 373–378.

Phillips, R.W. et al., "Evaporated Dielectric Colorless Films on PET and OPP Exhibiting High Barriers Toward Moisture and Oxygen" 36th Annual Technical Conference Proceedings, 1993, pp. 293–301, Dec. 1993.

Mahon J.K. et al., "Requirements of Flexible Substrates for Organic Light Emitting Devices in Flat Panel Display Applications" 42nd Annual Technical Conference Proceedings, 1999, pp. 456–459, Dec. 1999.

Affinito J D et al., "PML/Oxide/PML Barrier Layer Performance Differences Arising From Use Of UV Or Electron Beam Polymerization of the PML Layers" Thin Solid Films, Elsevier Science, S.A., vol. 308–309, Oct. 31, 1997, pp. 19–25.

Notification of Transmittal of the International Search Report Or The Declaration, Mar. 3, 2000, PCT/US99/29853.

Gustafsson, G et al., "Flexible light–emitting diodes made from soluble conducting polymers", Nature, vol. 357, Jun. 11, 1992, pp. 447–479.

Affinito, J D et al., "Polymer–Oxide Transparent Barrier Layers", SVC 39th Annual Technical Conference, Vacuum Web Coating Session, 1996, pp. 392–397.

Affinito J D et al., "PML/Oxide/PML Barrier Layer Performance Differences Arising From Use Of UV Or Electron Beam Polymerization Of The PML Layers" SVC 40th Annual Technical Conference. 1997, pp. 19–25.

Affinito, J.D., et al., "Vacuum Deposition of Polymer Electrolytes On Flexible Substrates", "Proceedings of the Ninth International Conference on Vacuum Web Coating", Nov. 1995 ed R. Bakish, Bakish Press 1995, p. 20–36.

Vossen, J.L., et al., Thin Film Processes, Academic Press, 1978, Part II, Chapter II–1, Glow Discharge Sputter Deposition, p. 12–63; Part IV, Chapter IV–1 Plasma Deposition of Inorganic Compounds and Chapter IV–2 Glow Discharge Polymerization, p. 335–397.

Penning, F.M., Electrical Discharges in Gasses, Gordon and Breach Science Publishers, 1965, Chapters 5–6, p. 19–35, and Chapter 8, p. 41–50.

Affinito, J.D., et al., "High Rate Vacuum Deposition of Polymer Electrolytes", Journal Vacuum Science Technology A 14(3), May/Jun. 1996.

Inoue et al., Proc. Jpn. Congr. Mater. Res., vol. 33, p. 177–9, 1990.

* cited by examiner

SMOOTHING AND BARRIER LAYERS ON HIGH TG SUBSTRATES

This application is a continuation-in-part of U.S. patent application Ser. No. 09/427,138, filed Oct. 25, 1999, entitled "Environmental Barrier Material For Organic Light Emitting Device And Method Of Making."

BACKGROUND OF THE INVENTION

The present invention relates generally to polymer substrates, and more particularly to high temperature polymer substrates having improved properties.

There is a need for versatile visual display devices for electronic products of many different types. Although many current displays use glass substrates, there is a trend toward the use of plastic substrates. Plastic substrates are critical to future generations of electronic products and associated technologies because they are light weight, impact resistant, and cost effective. However, temperature limitations and gas and liquid permeation limitations of plastics have prevented their use in most displays.

Many processes in the manufacture of displays, such as flat panel displays, require relatively high temperatures that cannot be tolerated by most polymer substrates. For example, the recrystallization of amorphous Si to poly-Si in thin film transistors requires substrate temperatures of at least 160°–250° C., even with pulsed excimer laser anneals. The conductivity of the transparent electrode, which is typically made of indium tin oxide, is greatly improved if deposition occurs above 220° C. Polyimide curing generally requires temperatures of 250° C. In addition, many of the photolithographic process steps for patterning electrodes are operated in excess of 120° C. to enhance processing speeds in the fabrication. These processes are used extensively in the manufacture of display devices, and they have been optimized on glass and silicon substrates. The high temperatures needed for the processes can deform and damage a plastic substrate, and subsequently destroy the display. If displays are to be manufactured on flexible plastic materials, the plastic must be able to withstand the process conditions, including high temperatures over 100° C., harsh chemicals, and mechanical damage.

Flexible plastic materials having a high glass transition temperature hold great promise for use in displays. As used herein, the term polymers having a high glass transition temperature is defined as those with a glass transition temperature greater than about 120° C., preferably greater than about 150° C., and most preferably greater than about 200° C. Examples of such polymers include, but are not limited to, polynorbornene (Tg: 320° C.), polyimide (Tg: 270–388° C.), polyethersulphone (Tg: 184–230° C.), polyetherimide, (Tg: 204–299° C.), polyarylate (Tg: 148–245° C.), polycarbonate (Tg: 150° C.), and a high glass transition temperature cyclic olefin polymer (Tg: 171° C., sold under the trade name Transphan™, available from Lofo High Tech Film, GMBH of Weil am Rhein, Germany). Because of their temperature stability and high glass transition temperature, these materials offer promise in overcoming the temperature limitations of existing commodity polymers, such as polyethylene terephthalate (Tg: 78° C.), and polyethylene naphthanate (Tg: 120° C.).

However, polymers having high glass transition temperatures are often inherently mechanically weak, easily scratched, low in chemical resistance, and possess high oxygen and water permeability. Their poor properties make processing difficult. In addition, their high oxygen and water permeation rates, and poor surface finish preclude their use as substrates for sensitive display devices.

Many different display devices are presently being used, including liquid crystal displays (LCDs), light emitting diodes (LEDs), light emitting polymers (LEPs), electronic signage using electrophoretic inks, electroluminescent devices (EDs), and phosphorescent devices. Many of these display devices are environmentally sensitive. As used herein, the term environmentally sensitive display device means display devices which are subject to degradation caused by permeation of environmental gases or liquids, such as oxygen and water vapor in the atmosphere or chemicals used in the processing of the electronic product.

The gas and liquid permeation resistance of plastics is poor, often several orders of magnitude below what is required for sustained device performance. For example, the oxygen and water vapor permeation rates for polynorbornene and Transphan™ are over 1000 cc/m$^2$/day (at 23° C.). The rate required to provide a sufficient lifetime for an organic light emitting device has been calculated to be approximately $10^{-6}$ cc/m$^2$/day (at 23° C.). The environmental sensitivity of the display devices limits the lifetime, reliability, and performance of devices constructed on plastics, which has retarded the development of display devices made with plastic substrates.

Thus, there is a need for a high temperature substrate having improved properties, including ultra-low gas and liquid permeation, scratch resistance, and chemical resistance, which can be used as a support for display devices, and for methods for making such substrates.

SUMMARY OF THE INVENTION

The present invention meets these need by providing a high temperature substrate having improved properties and a method for making such a substrate. The substrate includes a polymer substrate having a glass transition temperature greater than about 120° C., and at least one first barrier stack adjacent to the polymer substrate. The barrier stack includes at least one first barrier layer and at least one first polymer layer. The high temperature substrate optionally includes an environmentally sensitive display device adjacent to the first barrier stack and at least one second barrier stack adjacent to the environmentally sensitive display device. By adjacent, we mean next to but not necessarily directly next to. There can be additional layers intervening between the adjacent layers. The second barrier stack includes at least one second barrier layer and at least one second polymer layer.

Preferably, either one or both of the first and second barrier layers of the first and second barrier stacks is substantially transparent. At least one of the first barrier layers preferably comprises a material selected from metal oxides, metal nitrides, metal carbides, metal oxynitrides, metal oxyborides, and combinations thereof.

Either one of the first and second barrier layers can be substantially opaque, if desired. The opaque barrier layers are preferably selected from opaque metals, opaque polymers, opaque ceramics, and opaque cermets.

The polymer layers of the first and second barrier stacks are preferably acrylate-containing polymers. As used herein, the term acrylate-containing polymers includes acrylate-containing polymers, methacrylate-containing polymers, and combinations thereof. The polymer layers in the first and/or the second barrier stacks can be the same or different.

The high temperature substrate can include additional layers if desired, such as polymer smoothing layers, scratch resistant layers, antireflective coatings, or other functional layers.

The present invention also involves a method of making the high temperature substrate having improved properties. The method includes providing a polymer substrate having a glass transition temperature greater than about 120° C., and placing at least one first barrier stack on the polymer substrate. The barrier stack includes at least one first barrier layer and at least one first polymer layer.

The barrier stack can be placed on the substrate by deposition or by lamination. The deposition is preferably vacuum deposition, and the lamination can be performed using an adhesive, solder, ultrasonic welding, pressure, or heat.

An environmentally sensitive display device can be placed on the first barrier stack, either by deposition or lamination. A second barrier stack can be placed on the environmentally sensitive display device. The second barrier stack includes at least one second barrier layer and at least one second polymer layer. The second barrier stack can be deposited on the environmentally sensitive display device, preferably by vacuum deposition.

Accordingly, it is an object of the present invention to provide a high temperature substrate having improved properties, and to provide a method of making such a substrate.

DESCRIPTION OF THE INVENTION

Figure 1:
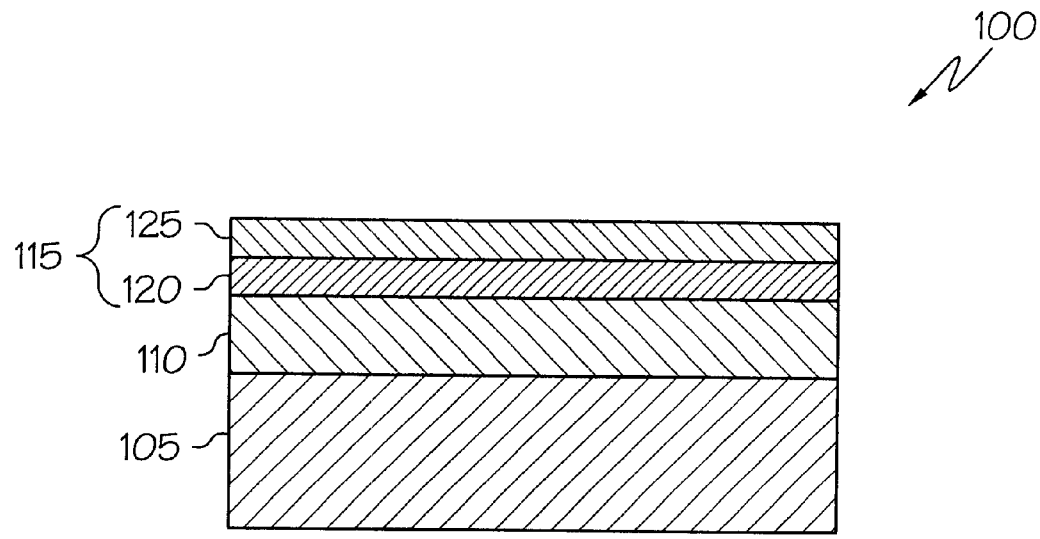
FIG. 1 is a cross-section of one embodiment of the high temperature substrate of the present invention.

One embodiment of the encapsulated display device of the present invention is shown in FIG. 1. The high temperature coated substrate 100 includes a substrate 105, a polymer smoothing layer 110, and a first barrier stack 115. The first barrier stack 115 includes a barrier layer 120 and a polymer layer 125. The first barrier stack 115 prevents environmental oxygen and water vapor from permeating through the substrate 105.

The substrate 105 is made of a polymer having a glass transition temperature greater than about 120° C., preferably greater than about 150° C., and more preferably greater than 200° C. Examples of such polymers include, but are not limited to, polynorbornene, polyimide, polyethersulfone, polyetherimide, polyarylate, polycarbonate, and high glass transition temperature cyclic olefin polymers.

In each barrier stack 115, there can be one or more barrier layers 120 and one or more polymer layers 125. The barrier layers and polymer layers in the barrier stack can be made of the same material or of a different material. The barrier layers are typically about 100–400 Å thick, and the polymer layers are typically about 1000–10,000 Å thick.

Although FIG. 1 shows a barrier stack with a single barrier layer and a single polymer layer, the barrier stacks can have one or more polymer layers and one or more barrier layers. There could be one polymer layer and one barrier layer, there could be one or more polymer layers on one side of one or more barrier layers, or there could be one or more polymer layers on both sides of one or more barrier layers. The important feature is that the barrier stack have at least one polymer layer and at least one barrier layer.

There can be additional overcoat layers on top of the barrier stack, such as organic or inorganic layers, planarizing layers, transparent conductors, antireflective coatings, or other functional layers, if desired.

Figure 2:
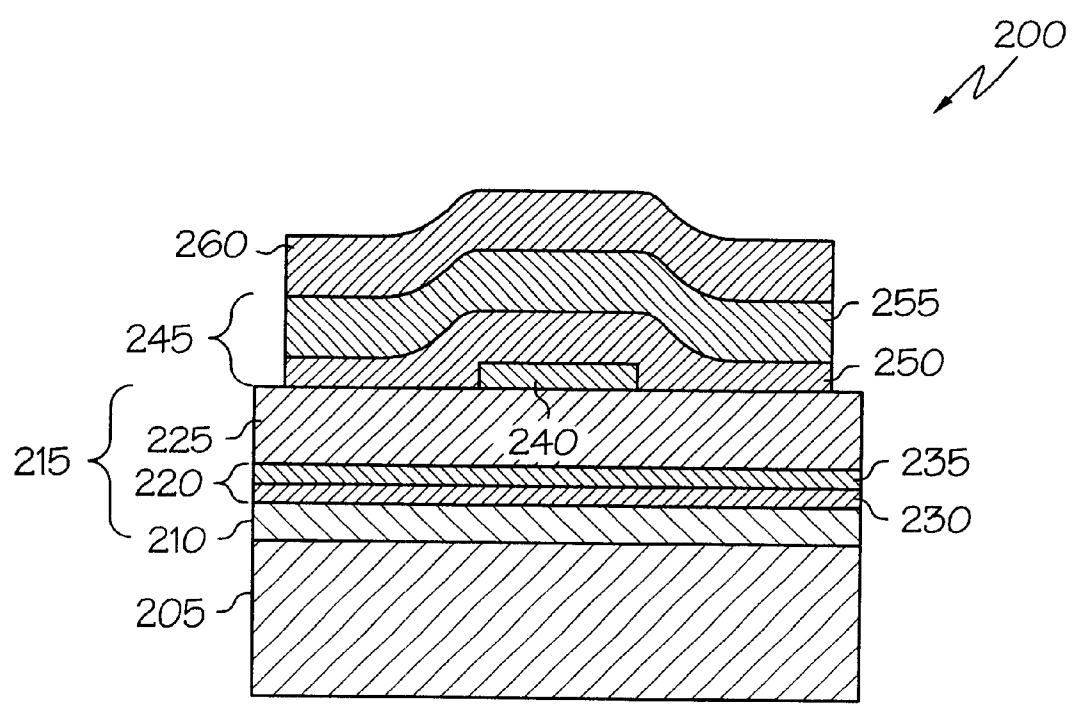
FIG. 2 is a cross-section of an encapsulated display device using the high temperature substrate of the present invention.

An encapsulated display device made with the high temperature substrate of the present invention is shown in FIG. 2. The encapsulated display device 200 has a substrate 205, as described above. On top of the substrate 205, there is a polymer smoothing layer 210. The polymer smoothing layer 210 decreases surface roughness, and encapsulates surface defects, such as pits, scratches, and digs. This produces a planarized surface which is ideal for deposition of subsequent layers. Depending on the desired application, there can be additional layers deposited on the substrate 205, such as organic or inorganic layers, planarizing layers, electrode layers, scratch resistant layers, antireflective coatings, and other functional layers. In this way, the substrate can be specifically tailored to different applications.

The first barrier stack 215 is above the polymer smoothing layer 210. The first barrier stack 215 includes a first barrier layer 220 and a first polymer layer 225. The first barrier layer 220 includes barrier layers 230 and 235. Barrier layers 230 and 235 can be made of the same barrier material or of different barrier materials.

An environmentally sensitive display device 240 is placed over the first barrier stack 215. The environmentally sensitive display device 240 can be any display device which is environmentally sensitive. Examples of environmentally sensitive display devices include, but are not limited to liquid crystal displays (LCDs), light emitting diodes (LEDs), light emitting polymers (LEPs), electronic signage using electrophoretic inks, electroluminescent devices (EDs), and phosphorescent devices. These display devices can be made using known techniques, such as those described in U.S. Pat. Nos. 6,025,899, 5,995,191, 5,994,174, 5,956,112 (LCDs); U.S. Pat. Nos. 6,005,692, 5,821,688, 5,747,928 (LEDs); U.S. Pat. Nos. 5,969,711, 5,961,804, 4,026,713 (E Ink); U.S. Pat. Nos. 6,023,373, 6,023,124, 6,023,125 (LEPs); and U.S. Pat. Nos. 6,023,073, 6,040,812, 6,019,654, 6,018,237, 6,014,119, 6,010,796 (EDs), which are incorporated herein by reference.

There is a second barrier stack 245 placed over the environmentally sensitive display device 240 to encapsulate it. The second barrier stack 245 has a second barrier layer 250 and a second polymer layer 255, although it can have one or more barrier layers and one or more polymer layers, as discussed above. The barrier layers and polymer layers in the first and second barrier stacks can be the same or they can be different.

Although only one first barrier stack and only one second barrier stack are shown in FIG. 2, the number of barrier stacks is not limited. The number of barrier stacks needed depends on the substrate material used and the level of permeation resistance needed for the particular application. One or two barrier stacks should provide sufficient barrier properties for some applications. The most stringent applications may require five or more barrier stacks.

There is optionally a lid 260 over the second barrier stack 245. The lid can be can be rigid or flexible. It is preferably made of the same materials as the substrate 205. Alternatively, flexible lids could be made of any flexible material, including, but not limited to other polymers, metal, paper, fabric, and combinations thereof. Rigid substrates are preferably ceramics, metal, or semiconductors.

The method of making the high temperature substrate with improved properties will be described with reference to the embodiment shown in FIG. 2. Any initial layers which are desired, such as scratch resistant layers, planarizing layers, electrically conductive layers, etc., can be coated, deposited, or otherwise placed on the substrate. A polymer smoothing layer is preferably included to provide a smooth base for the remaining layers. It can be formed by depositing a layer of polymer, for example, an acrylate-containing polymer, onto the substrate or previous layer. The polymer layer can be deposited in vacuum or by using atmospheric processes such as spin coating and/or spraying. Preferably, an acrylate-containing monomer, oligomer, or resin is deposited and then polymerized in situ to form the polymer layer. As used herein, the term acrylate-containing monomer, oligomer, or resin includes acrylate-containing monomers, oligomers, and resins, methacrylate-containing monomers, oligomers, and resins, and combinations thereof.

The first barrier stack is then placed on the substrate. The first and second barrier stacks include at least one barrier layer and at least one polymer layer. The barrier stacks are preferably made by vacuum deposition. The barrier layer can be vacuum deposited onto the polymer smoothing layer, substrate, or previous layer. The polymer layer is then deposited on the barrier layer, preferably by flash evaporating acrylate-containing monomers, oligomers, or resins, condensing on the barrier layer, and polymerizing in situ in a vacuum chamber. U.S. Pat. Nos. 5,440,446 and 5,725,909, which are incorporated herein by reference, describe methods of depositing thin film, barrier stacks.

Vacuum deposition includes flash evaporation of acrylate-containing monomer, oligomer, or resin with in situ polymerization under vacuum, plasma deposition and polymerization of acrylate-containing monomer, oligomer, or resin, as well as vacuum deposition of the barrier layers by sputtering, chemical vapor deposition, plasma enhanced chemical vapor deposition, evaporation, sublimation, electron cyclotron resonance-plasma enhanced vapor deposition (ECR-PECVD), and combinations thereof.

In order to protect the integrity of the barrier layer, the formation of defects and/or microcracks in the deposited layer subsequent to deposition and prior to downstream processing should be avoided. The encapsulated display device is preferably manufactured so that the to barrier layers are not directly contacted by any equipment, such as rollers in a web coating system, to avoid defects that may be caused by abrasion over a roll or roller. This can be accomplished by designing the deposition system such that the barrier layers are always covered by polymer layers prior to contacting or touching any handling equipment.

The environmentally sensitive display device is then placed on the first barrier layer. The environmentally sensitive display device can be placed on the substrate by deposition, such as vacuum deposition. Alternatively it can be placed on the substrate by lamination. The lamination can use an adhesive, glue, or the like, or heat to seal the environmentally sensitive display device to the substrate.

The second barrier stack is then placed over the environmentally sensitive display device to encapsulate it. The second barrier stack can be placed over the environmentally sensitive display device by deposition or lamination.

The barrier layers in the first and second barrier stacks may be any barrier material. The barrier layers in the first and second barrier stacks can be made of the same material or a different material. In addition, multiple barrier layers of the same or different barrier materials can be used in a barrier stack.

The barrier layers can be transparent or opaque, depending on the design and application of the display device. Preferred transparent barrier materials include, but are not limited to, metal oxides, metal nitrides, metal carbides, metal oxynitrides, metal oxyborides, and combinations thereof. The metal oxides are preferably selected from silicon oxide, aluminum oxide, titanium oxide, indium oxide, tin oxide, indium tin oxide, tantalum oxide, zirconium oxide, niobium oxide, and combinations thereof. The metal nitrides are preferably selected from aluminum nitride, silicon nitride, boron nitride, and combinations thereof. The metal oxynitrides are preferably selected from aluminum oxynitride, silicon oxynitride, boron oxynitride, and combinations thereof.

For most devices, only one side of the device must be transparent. Therefore, opaque barrier layers can be used in some barrier stacks depending on the design of the display device. Opaque barrier materials include, but are not limited to, metals, ceramics, polymers, and cermets. Examples of opaque cermets include, but are not limited to, zirconium nitride, titanium nitride, hafnium nitride, tantalum nitride, niobium nitride, tungsten disilicide, titanium diboride, and zirconium diboride.

The polymer layers of the first and second barrier stacks are preferably acrylate-containing monomers, oligomers, or resins. The polymer layers in the first and second barrier stacks can be the same or different. In addition, the polymer layers within each barrier stack can be the same or different.

In a preferred embodiment, the barrier stack includes a polymer layer and two barrier layers. The two barrier layers can be made from the same barrier material or from different barrier materials. The thickness of each barrier layer in this embodiment is about one half the thickness of the single barrier layer, or about 50 to 200 Å. There are no limitations on the thickness, however.

When the barrier layers are made of the same material, they can be deposited either by sequential deposition using two sources or by the same source using two passes. If two deposition sources are used, deposition conditions can be different for each source, leading to differences in microstructure and defect dimensions. Any type of deposition source can be used. Different types of deposition processes, such as magnetron sputtering and electron beam evaporation, can be used to deposit the two barrier layers.

The microstructures of the two barrier layers are mismatched as a result of the differing deposition sources/parameters. The barrier layers can even have different crystal structure. For example, $Al_2O_3$ can exist in different phases (alpha, gamma) with different crystal orientations. The mismatched microstructure can help decouple defects in the adjacent barrier layers, enhancing the tortuous path for gases and water vapor permeation.

When the barrier layers are made of different materials, two deposition sources are needed. This can be accomplished by a variety of techniques. For example, if the materials are deposited by sputtering, sputtering targets of different compositions could be used to obtain thin films of different compositions. Alternatively, two sputtering targets of the same composition could be used but with different reactive gases. Two different types of deposition sources could also be used. In this arrangement, the lattices of the two layers are even more mismatched by the different microstructures and lattice parameters of the two materials.

A single pass, roll-to-roll, vacuum deposition of a three layer combination on a PET substrate, i.e., PET substrate/polymer layer/barrier layer/polymer layer, can be more than five orders of magnitude less permeable to oxygen and water vapor than a single oxide layer on PET alone. See J. D. Affinito, M. E. Gross, C. A. Coronado, G. L. Graff, E. N.

Greenwell, and P. M. Martin, *Polymer-Oxide Transparent Barrier Layers Produced Using PML Process*, 39th Annual Technical Conference Proceedings of the Society of Vacuum Coaters, Vacuum Web Coating Session, 1996, pages 392–397; J. D. Affinito, S. Eufinger, M. E. Gross, G. L. Graff, and P. M. Martin, *PML/Oxide/PML Barrier Layer Performance Differences Arising From Use of UV or Electron Beam Polymerization of the PML Layers*, Thin Solid Films, Vol.308, 1997, pages 19–25. This is in spite of the fact that the effect on the permeation rate of the polymer multilayers (PML) layers alone, without the barrier layer (oxide, metal, nitride, oxynitride) layer, is barely measurable. It is believed that the improvement in barrier properties is due to two factors. First, permeation rates in the roll-to-roll coated oxide-only layers were found to be conductance limited by defects in the oxide layer that arose during deposition and when the coated substrate was wound up over system idlers/rollers. Asperities (high points) in the underlying substrate are replicated in the deposited inorganic barrier layer. These features are subject to mechanical damage during web handling/take-up, and can lead to the formation of defects in the deposited film. These defects seriously limit the ultimate barrier performance of the films. In the single pass, polymer/barrier/polymer process, the first acrylic layer planarizes the substrate and provides an ideal surface for subsequent deposition of the inorganic barrier thin film. The second polymer layer provides a robust "protective" film that minimizes damage to the barrier layer and also planarizes the structure for subsequent barrier layer (or environmentally sensitive display device) deposition. The intermediate polymer layers also decouple defects that exist in adjacent inorganic barrier layers, thus creating a tortuous path for gas diffusion.

The permeability of the barrier stacks used in the present invention is shown in Table 1. The barrier stacks of the present invention on polymeric substrates, such as PET, have measured oxygen transmission rate (OTR) and water vapor transmission rate (WVTR) values well below the detection limits of current industrial instrumentation used for permeation measurements (Mocon OxTran 2/20L and Permatran). Table 1 shows the OTR and WVTR values (measured according to ASTM F 1927-98 and ASTM F 1249-90, respectively) measured at Mocon (Minneapolis, Minn.) for several barrier stacks on PET and polynorbornene (PNB), along with some other measured values.

TABLE 1

| Sample | Oxygen Permeation Rate (cc/m$^2$/day) | | Water Vapor Permeation (g/m$^2$/day)[+] | |
|---|---|---|---|---|
|  | 23° C. | 38° C. | 23° C. | 38° C. |
| Native 7 mil PET | 7.62 | — | — | — |
| Transphan ™[1] | >1000 |  |  |  |
| Native PNB[1] | >1000 |  |  |  |
| 2-barrier stacks on PNB | 1 |  |  |  |
| 1-barrier stack | <0.005 | <0.005* | — | 0.46[+] |
| 1-barrier stack with ITO | <0.005 | <0.005* | — | 0.011[+] |
| 2-barrier stacks | <0.005 | <0.005* | — | <0.005[+] |
| 2-barrier stacks with ITO | <0.005 | <0.005* | — | <0.005[+] |
| 5-barrier stacks | <0.005 | <0.005* | — | <0.005[+] |
| 5-barrier stacks with ITO | <0.005 | <0.005* | — | <0.005[+] |

*38° C., 90% RH, 100% O$_2$
[+]38° C., 100% RH
[1]Measured according to ASTM F 1927-98.

As the data in Table 1 shows, the barrier stacks of the present invention provide oxygen and water vapor permeation rates several orders of magnitude better than PET alone. Typical permeation rates for other barrier coatings range from 0.1 to 1 cc/m$^2$/day. The barrier stacks are extremely effective in preventing oxygen and water penetration to the underlying components, and substantially outperform other barrier coatings on the market.

Two barrier stacks were applied to the polynorbornene. At a temperature of 23° C., the two barrier stacks reduced the oxygen permeation rate from>1000 cc/m$^2$/day to 1 cc/m$^2$/day, an improvement of more than three orders of magnitude. The polynorbornene used in the preliminary evaluation was a prototype material and had very poor surface quality (pits, scratches, and other surface defects). It is believed that the oxygen and water vapor permeation rates can be reduced to <0.005 cc/m$^2$/day by using a better quality substrate material and more barrier stacks.

The preferred deposition process is compatible with a wide variety of substrates. Because the preferred process involves flash evaporation of a monomer and magnetron sputtering, deposition temperatures are well below 100° C., and stresses in the coating can be minimized. Multilayer coatings can be deposited at high deposition rates. No harsh gases or chemicals are used, and the process can be scaled up to large substrates and wide webs. The barrier properties of the coating can be tailored to the application by controlling the number of layers, the materials, and the layer design.

The barrier stacks and polymer smoothing layers of the present invention have been shown to smooth substrate surfaces with submicron roughness effectively to a roughness of less than 10 Å. In addition, because they include crosslinked polymer layers and hard inorganic layers, the barrier stacks provide a degree of chemical resistance and scratch resistance to the substrate.

Thus, the present invention provides a substrate having a high glass transition temperature, a smooth surface, exceptional barrier properties, improved durability, improved chemical resistance, and improved scratch resistance. The high temperature substrate permits the production of an encapsulated environmentally sensitive display device.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A high temperature substrate having improved properties consisting essentially of:
    a polymer substrate having a glass transition temperature greater than 120° C.; and
    at least one first barrier stack consisting essentially of at least one first barrier layer and at least one first polymer layer, the at least one first barrier stack adjacent to the polymer substrate, wherein the oxygen transmission rate through the at least one first barrier stack is less than 0.005 cc/m$^2$/day at 23° C. and 0% relative humidity.

2. The high temperature substrate of claim 1 wherein the polymer substrate is selected from the group consisting of polynorbornene, polyimide, polyethersulfone, polyetherimide, polycarbonate, and high glass transition temperature cyclic olefin polymers.

3. The high temperature substrate of claim 1 wherein the at least one first barrier layer is substantially transparent.

4. The high temperature substrate of claim 1 wherein at least one of the at least one first barrier layer comprises a material selected from the group consisting of metal oxides, metal nitrides, metal carbides, metal oxynitrides, metal oxyborides, and combinations thereof.

5. The high temperature substrate of claim 4 wherein the material is selected from the group consisting of silicon oxide, aluminum oxide, titanium oxide, indium oxide, tin oxide, indium tin oxide, tantalum oxide, zirconium oxide, niobium oxide, and combinations thereof.

6. The high temperature substrate of claim 4 wherein the material is selected from the group consisting of aluminum nitride, silicon nitride, boron nitride, and combinations thereof.

7. The high temperature substrate of claim 4 wherein the material is selected from the group consisting of aluminum oxynitride, silicon oxynitride, boron oxynitride, and combinations thereof.

8. The high temperature substrate of claim 1 wherein the at least one first barrier layer is substantially opaque.

9. The high temperature substrate of claim 1 wherein at least one of the at least one first barrier layer is selected from the group consisting of opaque metals, opaque polymers, opaque ceramics, and opaque cermets.

10. The high temperature substrate of claim 1 wherein at least one of the at least one first polymer layers comprises an acrylate-containing polymer.

11. The high temperature substrate of claim 1 further comprising a polymer smoothing layer adjacent to the polymer substrate.

12. The high temperature substrate of claim 1 wherein the at least one first barrier layer comprises two barrier layers.

13. The high temperature substrate of claim 1 wherein the oxygen transmission rate through the at least one first barrier stack is less than 0.005 cc/m$^2$/day at 38° C. and 90% relative humidity.

14. The high temperature substrate of claim 1 wherein the water vapor transmission rate through the at least one first barrier stack is less than 0.005 g/m$^2$/day at 38° C. and 100% relative humidity.

15. The high temperature substrate of claim 1 further comprising an environmentally sensitive display device adjacent to the at least one first barrier stack.

16. The high temperature substrate of claim 15 further comprising at least one second barrier stack comprising at least one second barrier layer and at least one second polymer layer, the at least one second barrier stack adjacent to the environmentally sensitive display device, wherein the at least one second barrier stack encapsulates the environmentally sensitive display device.

17. The high temperature substrate of claim 16 further comprising a lid adjacent to the at least one second barrier stack.

18. The high temperature substrate of claim 1 wherein the polymer substrate has a glass transition temperature greater than about 150° C.

19. The high temperature substrate of claim 1 wherein the polymer substrate has a glass transition temperature greater than about 200° C.

* * * * *